United States Patent
Gune et al.

(12) 
(10) Patent No.: US 6,474,553 B1
(45) Date of Patent: Nov. 5, 2002

(54) CHEST OF COUNTING GRIDS FOR INDICATING A COUNT OF IC PACKAGES FOR A PLURALITY OF TYPES OF IC PACKAGE TRAYS

(75) Inventors: Rahul V. Gune, Pakkred Nonthaburi (TH); Watcharin Pinlam, Pathumthanee (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 233 days.

(21) Appl. No.: 09/661,775

(22) Filed: Sep. 14, 2000

(51) Int. Cl.[7] ............................................... G06K 15/00
(52) U.S. Cl. ...................... 235/383; 209/522
(58) Field of Search .................. 29/832, 739, 833, 29/740; 206/459.1, 459.5, 722, 723, 725; 235/383, 436, 438; 209/509

(56) References Cited

U.S. PATENT DOCUMENTS

| | | | | |
|---|---|---|---|---|
| 4,940,935 A | * | 7/1990 | Riley | 324/755 |
| 5,210,939 A | * | 5/1993 | Mallik et al. | 228/170 |
| 5,834,838 A | * | 11/1998 | Anderson | 257/693 |
| 5,957,293 A | * | 9/1999 | Pakeriasamy | 206/565 |
| 6,202,858 B1 | * | 3/2001 | Moewes | 198/370.01 |
| 6,296,122 B1 | * | 10/2001 | Nakazono et al. | 206/511 |
| 6,338,408 B1 | * | 1/2002 | Anderson | 206/1.5 |

* cited by examiner

*Primary Examiner*—Michael G. Lee
*Assistant Examiner*—Kimberly Nguyen
(74) *Attorney, Agent, or Firm*—Monica H. Choi (57) ABSTRACT

Each counting grid of a plurality of counting grids has respective counting labels corresponding to a respective type of IC package tray. Each of the respective counting labels are arranged to be over a respective pocket of the respective type of IC package tray corresponding to a counting grid when the counting grid is placed over the respective type of IC package tray. In addition, the respective counting labels of the counting grid are numerically ordered according to an order of filling the pockets of the respective type of IC package tray. A chest includes a bottom opening for holding an IC package tray that is partially filled with IC packages. The chest further includes a plurality of slots disposed through the chest with each slot holding a respective one of the counting grids. The chest also includes a plurality of viewing windows through the top of the chest with each viewing window being aligned over a respective one of the predetermined number of rows of pockets of the IC package tray. The counting labels of each of the counting grids does not appear in the viewing windows when each of the counting grids are at a respective hidden position. However, a respective counting grid corresponding to the IC package tray placed at the bottom opening of the chest is pulled to a visible position such that the counting labels on this counting grid are visible through the viewing windows of the chest. Then, a counting label, of the respective counting grid, over a last pocket to be filled within the IC package tray indicates the count of IC packages within the IC package tray placed at the bottom opening of the chest.

24 Claims, 6 Drawing Sheets

CHEST OF COUNTING GRIDS FOR INDICATING A COUNT OF IC PACKAGES FOR A PLURALITY OF TYPES OF IC PACKAGE TRAYS

TECHNICAL FIELD

The present invention relates generally to manufacture of IC (integrated circuit) packages, and more particularly, to a chest of counting grids for efficiently indicating a count of IC packages within a partially filled IC package tray for a plurality of types of IC package trays.

BACKGROUND OF THE INVENTION

During manufacture of IC (integrated circuit) packages, the IC packages are carried by IC package trays having a plurality of pockets with each pocket carrying a respective IC package. Depending on the size of IC packages being manufactured, different types of IC package trays have different numbers of pockets for carrying different numbers of IC packages.

Figure 1:
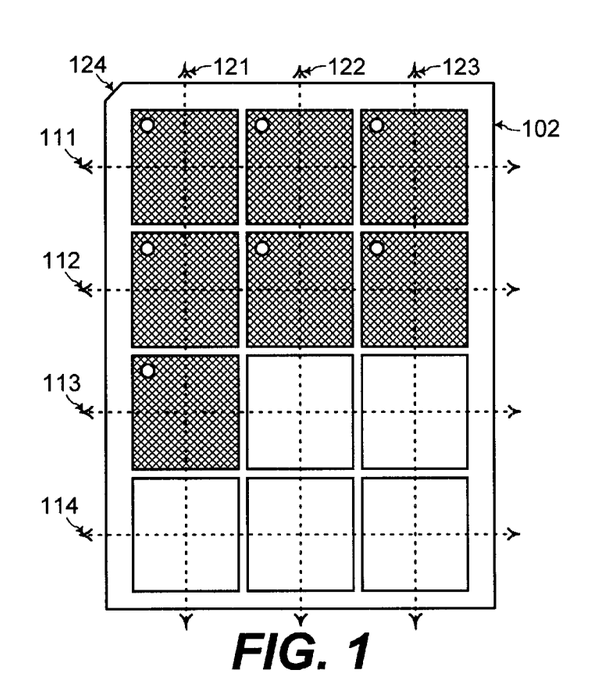
FIG. 1 shows a top view of an example first IC package tray having four rows by three columns of pockets for holding IC packages.

Referring to FIG. 1 for example, a first IC package tray 102 has twelve pockets for carrying twelve IC packages. The twelve pockets are arranged in four rows including a first row 111, a second row 112, a third row 113, and a fourth row 114, and are arranged in three columns including a first column 121, a second column 122, and a third column 123. The first IC package tray 102 has an orientation facet surface 124 for indicating the location of the first row 111 and the first column 121 on the first IC package tray 102 as the row and the column nearest the orientation facet surface 124.

During use of the first IC package tray 102, each pocket of the first IC package tray 102 carries one respective IC package. The IC packages are placed into the pockets of the first IC package tray 102 in a predetermined sequential order. For the example of the first IC package tray 102 of FIG. 1, this predetermined sequential order is to first fill the first row 111 starting from the first column 121, then the second column 122, and then the third column 123 within the first row 111 of pockets. After the first row 111 of pockets is filled, the second row 112 of pockets is filled with IC packages starting from the first column 121, then the second column 122, and then the third column 123 within the second row 112 of pockets. After the second row 112 of pockets is filled, the third row 113 of pockets is filled with IC packages starting from the first column 121, then the second column 122, and then the third column 123 within the third row 113 of pockets. After the third row 113 of pockets is filled, the fourth row 114 of pockets is filled with IC packages starting from the first column 121, then the second column 122, and then the third column 123 within the fourth row 114 of pockets.

Figure 2:
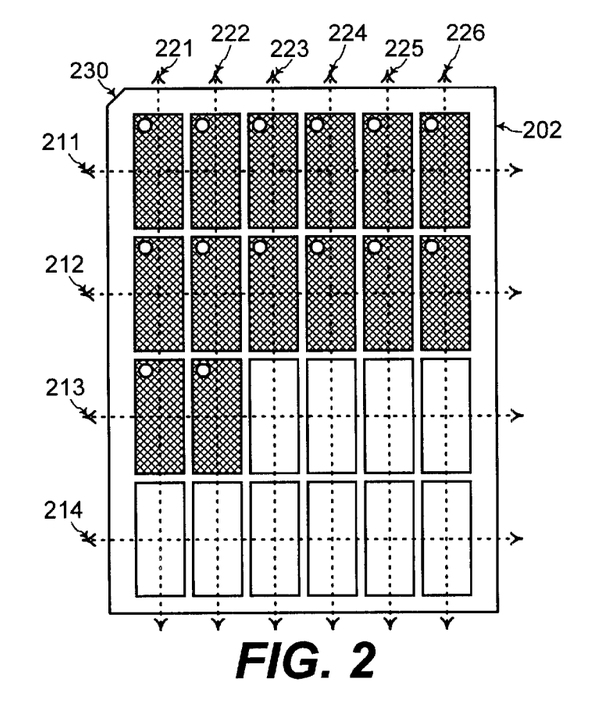
FIG. 2 shows a top view of an example second IC package tray having four rows by six columns of pockets for holding IC packages.

Depending on the size of IC packages being manufactured, different types of IC package trays have different numbers of pockets for carrying different numbers of IC packages. Referring to FIG. 2, for example, a second IC package tray 202 has twenty-four pockets for carrying twenty-four IC packages. The twenty-four pockets are arranged in four rows including a first row 211, a second row 212, a third row 213, and a fourth row 214, and are arranged in six columns including a first column 221, a second column 222, a third column 223, a fourth column 224, a fifth column 225, and a sixth column 226. The second IC package tray 202 has an orientation facet surface 230 for indicating the location of the first row 211 and the first column 221 on the second IC package tray 202 as the row and the column nearest the orientation facet surface 230. Referring to FIGS. 1 and 2, the first IC package tray 102 and the second IC package tray 202 have the same predetermined number of rows of pockets (i.e., four rows of pockets) but different numbers of columns of pockets (i.e., three columns of pockets for the first IC package tray 102 and six columns of pockets for the second IC package tray 202).

During use of the second IC package tray 202, each pocket of the second IC package tray 202 carries one respective IC package. The IC packages are placed into the pockets of the second IC package tray 202 in a predetermined sequential order. For the example of the second IC package tray 202 of FIG. 2, this predetermined sequential order is to first fill the first row 211 starting from the first column 221, then the second column 222, then the third column 223, then the fourth column 224, then the fifth column 225, and then the sixth column 226 within the first row 211 of pockets. After the first row 211 of pockets is filled, the second row 212 of pockets is filled with IC packages starting from the first column 221, then the second column 222, then the third column 223, then the fourth column 224, then the fifth column 225, and then the sixth column 226 within the second row 212 of pockets.

After the second row 212 of pockets is filled, the third row 213 of pockets is filled with IC packages starting from the first column 221, then the second column 222, then the third column 223, then the fourth column 224, then the fifth column 225, and then the sixth column 226 within the third row 213 of pockets. After the third row 213 of pockets is filled, the fourth row 214 of pockets is filled with IC packages starting from the first column 221, then the second column 222, then the third column 223, then the fourth column 224, then the fifth column 225, and then the sixth column 226 within the fourth row 214 of pockets.

In FIGS. 1 and 2, each IC package is placed within a pocket of the first IC package tray 102 or the second IC package tray 202 with proper orientation as indicated by an orientation marking (a circular marking) in the upper left corner of the IC package, as illustrated in FIGS. 1 and 2. During manufacture of IC packages, an IC package tray may be only partially filled. For example, in FIG. 1, the first IC package tray 102 is filled only to the pocket at the first column 121 of the third row 113. In FIG. 2, the second IC package tray 202 is filled only to the pocket at the second column 222 of the third row 213.

In any case, the number of IC packages within each of the IC package trays 102 and 202 is determined during manufacture of the IC packages. In the prior art, an operator manually counts the number of IC packages within a partially filled IC package tray for different types of IC package trays for carrying different numbers of IC packages. Unfortunately, the manual counting of the IC packages is prone to human error from fatigue as an operator continually counts the number of IC packages within numerous IC package trays during a work shift. The operator in some cases may count the number of IC packages in an IC package tray twice to ensure accuracy in counting the number of IC packages. Such a manual counting process of the prior art is also time-consuming.

Thus, a mechanism is desired for efficiently indicating the count of IC packages within a partially filled IC package tray for a plurality of types of IC package trays.

SUMMARY OF THE INVENTION

Accordingly, in a general aspect of the present invention, a mechanism includes a chest of counting grids for indicating a count of IC (integrated circuit) packages for a plurality of types of IC (integrated circuit) package trays. In one embodiment of the present invention, each of the plurality of types of IC package trays has a same predetermined number of rows of pockets for carrying IC packages, and each of the plurality of types of IC package trays has a respective number of columns of pockets for carrying IC packages.

In one aspect of the present invention, each counting grid of a plurality of counting grids has respective counting labels corresponding to a respective type of IC package tray. Each of the respective counting labels are arranged to be over a respective pocket of the respective type of IC package tray corresponding to a counting grid when the counting grid is placed over the respective type of IC package tray with the predetermined number of rows of counting labels on the counting grid being aligned to the predetermined number of rows of pockets of the respective type of IC package tray. In addition, the respective counting labels of the counting grid are numerically ordered according to an order of filling the pockets of the respective type of IC package tray.

In addition, a chest includes a bottom opening for holding an IC package tray that is partially filled with IC packages. The chest further includes a plurality of slots disposed through the chest with each slot holding a respective one of the counting grids disposed over and parallel with the IC package tray placed in the bottom opening of the chest such that the predetermined number of rows of counting labels of a counting grid are aligned to the predetermined number of rows of pockets of the IC package tray placed in the bottom opening of the chest. The chest also includes a plurality of viewing windows through the top of the chest with each viewing window being aligned over a respective one of the predetermined number of rows of pockets of the IC package tray placed in the bottom opening of the chest. Each row of counting labels of each of the counting grids within the chest is out of view through the viewing window when each of the counting grids are at a respective hidden position within the slots of the chest. However, a respective counting grid corresponding to the IC package tray placed in the bottom opening of the chest is placed to a respective visible position within the chest such that counting labels on the respective counting grid are visible through the plurality of viewing windows through the top of the chest. Then, a counting label of the respective counting grid over a last pocket to be filled within the IC package tray placed in the bottom opening of the chest indicates the count of IC packages within the IC package tray placed in the bottom opening of the chest.

In this manner, any of a plurality of types of IC package trays that is partially filled is placed at the bottom opening of the chest. The counting labels of a counting grid corresponding to the IC package tray placed at the bottom opening of chest is placed into view through the viewing windows of the chest. The counting label over a last pocket to be filled within the IC package tray placed in the bottom opening of the chest accurately indicates the count of IC packages within the IC package tray. Thus, an operator may be saved from the time and fatigue of manually counting the number of IC packages within numerous partially filled IC package trays for many different types of IC package trays during a work shift.

The present invention may also be practiced to particular advantage when each of the plurality of types of IC package trays has a same predetermined number of columns of pockets for carrying IC packages, and each of the plurality of types of IC package trays has a respective number of rows of pockets for carrying IC packages.

These and other features and advantages of the present invention will be better understood by considering the following detailed description of the invention which is presented with the attached drawings.

The figures referred to herein are drawn for clarity of illustration and are not necessarily drawn to scale. Elements having the same reference number in FIGS. 1, 2, 3, 4, 5, 6, 7, 8, 9, 10, 11, and 12 refer to elements having similar structure and function.

DETAILED DESCRIPTION

Figure 3:
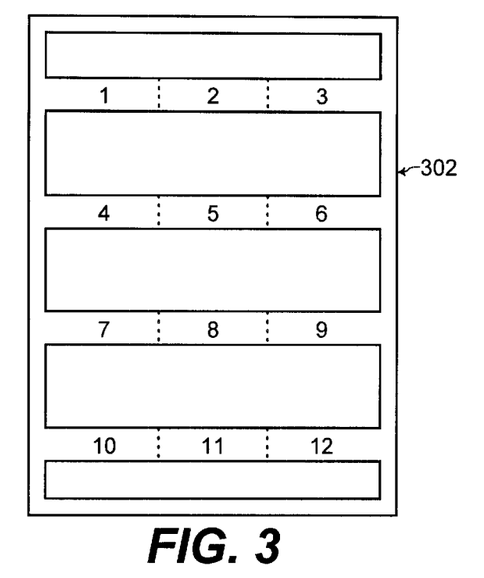
FIG. 3 shows a top view of a first counting grid having counting labels, corresponding to the first IC package tray of FIG. 1, used for indicating the count of IC packages within the first IC package tray of FIG. 1 when the first IC package tray of FIG. 1 is partially filled.

Referring to FIGS. 1 and 3, for efficiently indicating a count of IC packages within the first IC package tray 102, a first counting grid 302 has counting labels corresponding to the pockets of the first IC package tray 102. Referring to FIG. 3, the first counting grid 302 has a first row of counting labels "1 . . . 2 . . . 3" corresponding to the first column 121, the second column 122, and the third column 123, respectively, within the first row 111 of pockets of the first IC package tray 102. A second row of counting labels "4 . . . 5 . . . 6" corresponds to the first column 121, the second column 122, and the third column 123, respectively, within the second row 112 of pockets of the first IC package tray 102.

Similarly, a third row of counting labels "7 . . . 8 . . . 9" corresponds to the first column 121, the second column 122, and the third column 123, respectively, within the third row 113 of pockets of the first IC package tray 102. A fourth row of counting labels "10 . . . 11 . . . 12" corresponds to the first column 121, the second column 122, and the third column 123, respectively, within the fourth row 114 of pockets of the first IC package tray 102.

In this manner, the first counting grid 302 has the predetermined number of rows (i.e., four rows) of counting labels that correspond to the predetermined number of rows (i.e., four rows) of pockets of the first IC package tray 102. When the first counting grid 302 is placed over the first IC package tray 102, each of the counting labels is placed over a respective one of the pockets of the first IC package tray 102. In addition, the counting labels of the first counting grid 302 are numerically ordered according to the sequential order of filling the pockets of the first IC package tray 102 with IC packages (i.e., row by row from the first row 111 to the fourth row 114 and from the first column 121 to the third column 123 within each row for the first IC package tray 102).

Figure 4:
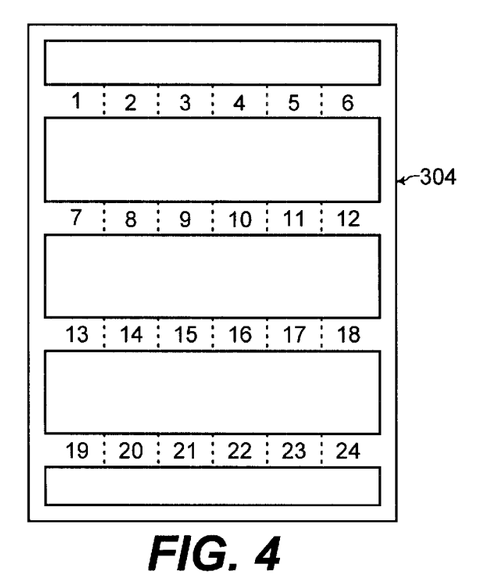
FIG. 4 shows a top view of a second counting grid having counting labels, corresponding to the second IC package tray of FIG. 2, used for indicating the count of IC packages within the second IC package tray of FIG. 2 when the second IC package tray of FIG. 2 is partially filled.

On the other hand, referring to FIGS. 2 and 4, for efficiently indicating a count of IC packages within the second IC package tray 202, a second counting grid 304 has counting labels corresponding to the pockets of the second IC package tray 202. Referring to FIG. 4, the second counting grid 304 has a first row of counting labels "1 . . . 2 . . . 3 . . . 4 . . . 5 . . . 6" corresponding to the first column 221, the second column 222, the third column 223, the fourth column 224, the fifth column 225, and the sixth column 226, respectively within the first row 211 of pockets of the second IC package tray 202. A second row of counting labels "7 . . . 8 . . . 9 . . . 10 . . . 11 . . . 12" corresponds to the first column 221, the second column 222, the third column 223, the fourth column 224, the fifth column 225, and the sixth column 226, respectively, within the second row 212 of pockets of the second IC package tray 202.

Similarly, a third row of counting labels "13 . . . 14 . . . 15 . . . 16 . . . 17 . . . 18" corresponds to the first column 221, the second column 222, the third column 223, the fourth column 224, the fifth column 225, and the sixth column 226, respectively, within the third row 213 of pockets of the second IC package tray 102. A fourth row of counting labels "19 . . . 20 . . . 21 . . . 22 . . . 23 . . . 24" corresponds to the first column 221, the second column 222, the third column 223, the fourth column 224, the fifth column 225, and the sixth column 226, respectively, within the fourth row 214 of pockets of the second IC package tray 202.

In this manner, the second counting grid 304 has the predetermined number of rows (i.e., four rows) of counting labels that correspond to the predetermined number of rows (i.e., four rows) of pockets of the second IC package tray 202. When the second counting grid 304 is placed over the second IC package tray 202, each of the counting labels is placed over a respective one of the pockets of the second IC package tray 202. In addition, the counting labels of the second counting grid 304 are numerically ordered according to the sequential order of filling the pockets of the second IC package tray 202 with IC packages (i.e., row by row from the first row 211 to the fourth row 214 and from the first column 221 to the sixth column 226 within each row for the second IC package tray 202).

Figure 5:
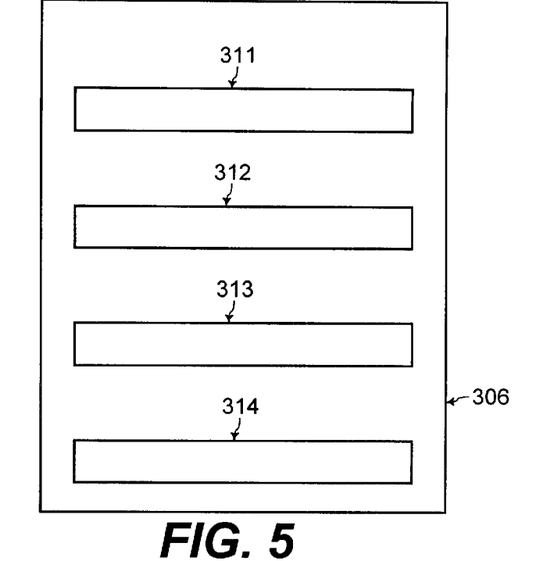
FIG. 5 shows a top view of a chest having four viewing windows on top of the chest.
Figure 6:
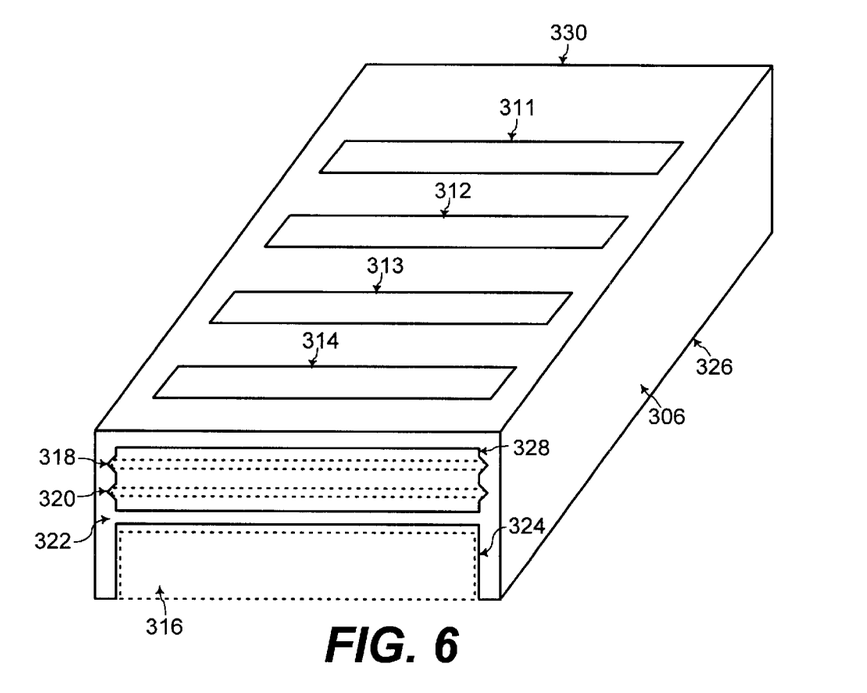
FIG. 6 shows an isometric view of the chest of FIG. 5 with a front side having openings for receiving an IC package tray at the bottom opening of the chest and for receiving the counting grids of FIGS. 3 and 4.

Referring to FIG. 5, a top view of a chest 306 shows a first viewing window 311, a second viewing window 312, a third viewing window 313, and a fourth viewing window 314 through the top of the chest 306. Referring to FIG. 6, the isometric view of the chest 306 shows a bottom opening 316 within the chest 306 for holding an IC package tray. The dashed lines in FIG. 6 illustrate the outline of a side of an IC package tray placed at the bottom opening 316 of the chest 306.

In addition, the chest 306 includes a plurality of slots including a first slot 318 and a second slot 320 for holding the first counting grid 302 of FIG. 3 and the second counting grid 304 of FIG. 4 within the chest 306. The dashed lines in the first slot 318 of FIG. 6 illustrate the outline of a side of the first counting grid 302 placed through the first slot 318 of the chest 306. Similarly, the dashed lines in the second slot 320 of FIG. 6 illustrate the outline of a side of the second counting grid 304 placed through the second slot 320 of the chest 306.

A front side 322 of the chest 306 includes a tray opening 324 through the front side 322 such that the IC package tray may be slid through the tray opening 324 at the front side of the chest 322 to be placed in the bottom opening 316 of the chest. Alternatively, the whole chest 306 may be open at a bottom side 326 such that the whole chest 306 may be picked up and placed over an IC package tray. In addition, the chest 306 includes a slot opening 328 at the front side 322 such that the first counting grid 302 is slid through the slot opening 328 at the front side 322 to be placed in the first slot 318 of the chest 306. Similarly, the second counting grid 304 is slid through the slot opening 328 at the front side 322 to be placed in the second slot 320.

Figure 7:
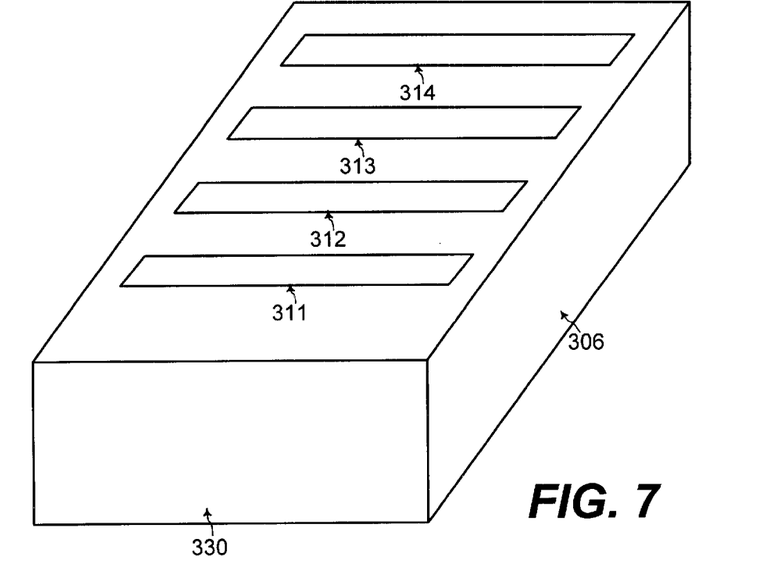
FIG. 7 shows an isometric view of the chest of FIG. 5 with a rear wall that is opposite of the front side of FIG. 6.

Referring to FIG. 7, an isometric view of the chest 306 from the rear shows a rear wall 330 of the chest 306. Referring to FIGS. 6 and 7, the chest is sized so that when an IC package tray is placed at the bottom opening 316 of the chest 306 with the IC package tray touching the rear wall 330 of the chest 306, each of the viewing windows 311, 312, 313, and 314 are aligned with a respective row of the IC package tray. For example, when the first IC package tray 102 of FIG. 1 or the second IC package tray 202 of FIG. 2 is placed at the bottom opening 316 of the chest 306, the first viewing window 311 of the chest 306 is aligned to be placed over the first row 111 or 211, the second viewing window 312 is aligned to be placed over the second row 112 or 212, the third viewing window 313 is aligned to be placed over the third row 113 or 213, and the fourth viewing window 314 is aligned to be placed over the fourth row 114 or 214.

In addition, referring to FIGS. 3, 6, 7, and 8, when the first counting grid 302 is slid in the first slot 318 of the chest 306 with the first counting grid 302 touching the rear wall 330 of the chest 306, the first counting grid 302 is at a hidden position where the counting labels of the first counting grid 302 do not appear through the viewing windows 311, 312, 313, and 314 of the chest 306. (The outline of the first counting grid 302 within the first slot 318 of the chest 306 is shown in dashed lines in FIG. 8.) The first counting grid 302 is initially slid into the first slot 318 of the chest 306 to this hidden position. The plane of the first counting grid 302 within the first slot 318 is parallel to the IC package tray placed at the bottom opening 316 of the chest 306.

Similarly, referring to FIGS. 4, 6, 7, and 9, when the second counting grid 304 is slid in the second slot 320 of the chest 306 with the second counting grid 304 touching the rear wall 330 of the chest 306, the second counting grid 304 is at a hidden position where the counting labels of the second counting grid 304 do not appear through the viewing windows 311, 312, 313, and 314 of the chest 306. (The outline of the second counting grid 304 within the second slot 320 of the chest 306 is shown in dashed lines in FIG. 9.) The second counting grid 304 is initially slid into the second slot 320 of the chest 306 to this hidden position. The plane of the second counting grid 304 within the second slot 320 is parallel to the IC package tray placed at the bottom opening 316 of the chest 306.

Figure 10:
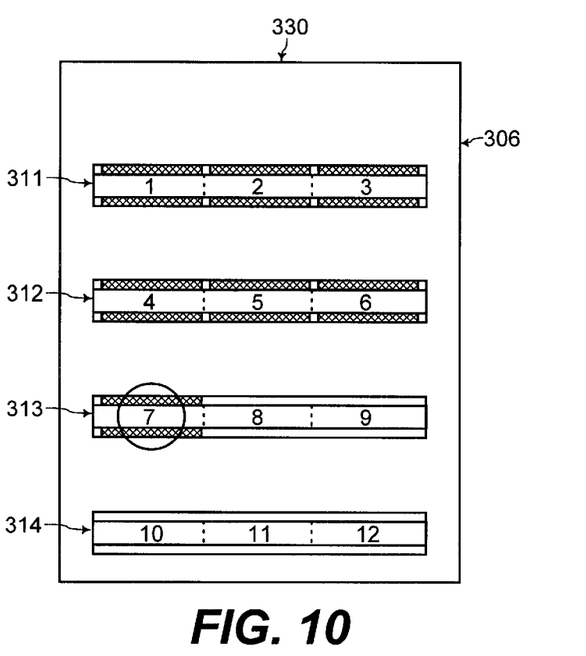
FIG. 10 shows the top view of the chest of FIG. 5 with the first counting grid of FIG. 3 at a respective visible position within the chest such that the counting labels of the first counting grid appear in the viewing windows of the chest when the first IC package tray of FIG. 1 is placed at the bottom opening of the chest.

For use of the chest 306 of the plurality of counting grids 302 and 304, an IC package tray is placed in the bottom opening 316 of the chest 306. Referring to FIGS. 1 and 10, for example, assume that the first IC package tray 102 of FIG. 1 is placed at the bottom opening 316 of the chest 306 with the first IC package tray 102 touching the rear wall 330 of the chest 306. In that case, the first viewing window 311 of the chest 306 is placed over the first row 111 of pockets of the first IC package tray 102, the second viewing window 312 is placed over the second row 112 of pockets of the first IC package tray 102, the third viewing window 313 is placed over the third row 113 of pockets of the first IC package tray 102, and the fourth viewing window 314 is placed over the fourth row 114 of pockets of the first IC package tray 102.

Figure 8:
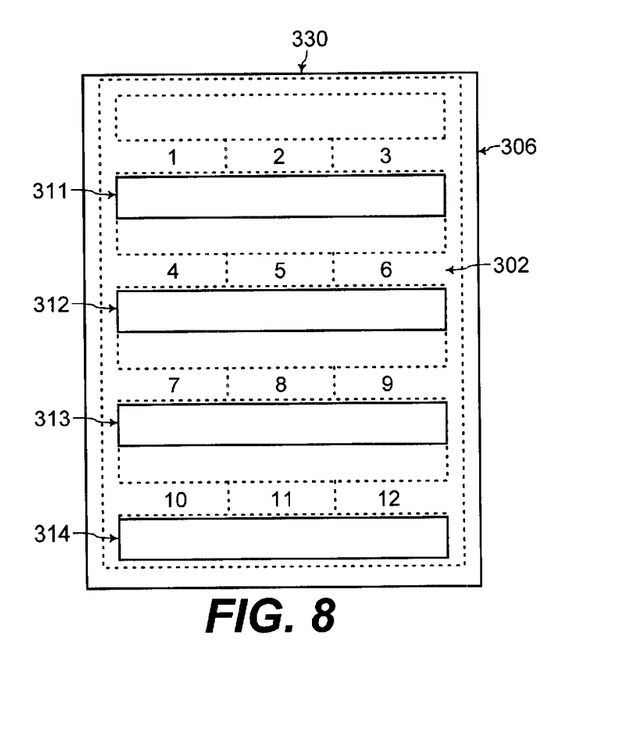
FIG. 8 shows the top view of the chest of FIG. 5 with the first counting grid of FIG. 3 at a respective hidden position within the chest such that the counting labels of the first counting grid do not appear in the viewing windows of the chest.

In addition, referring to FIGS. 8 and 10, the first counting grid 302 having the counting labels that correspond to the first IC package tray 102 is pulled out away from the rear wall 330 of the chest 306 until the counting labels of the first counting grid 302 appear through the viewing windows 311, 312, 313, and 314 of the chest 306. The first row of counting labels "1 . . . 2 . . . 3" appear through the first viewing window 311 of the chest 306, the second row of counting labels "4 . . . 5 . . . 6" appear through the second viewing window 312, the third row of counting labels "7 . . . 8 . . . 9" appear through the third viewing window 313, and the fourth row of counting labels "10 . . . 11 . . . 12" appear through the fourth viewing window 314.

Figure 9:
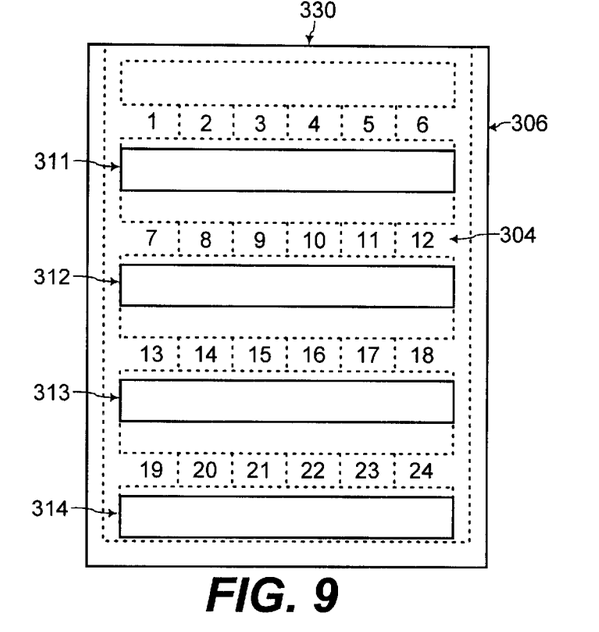
FIG. 9 shows the top view of the chest of FIG. 5 with the second counting grid of FIG. 4 at a respective hidden position within the chest such that the counting labels of the second counting grid do not appear in the viewing windows of the chest.

Referring to FIG. 9, note that the second counting grid 304 is still at the hidden position such that the counting labels of the second counting grid 304 do not appear through the viewing windows 311, 312, 313, and 314 of the chest 306. With the counting labels of the first counting grid 302 appearing through the viewing windows 311, 312, 313, and 314 of the chest 306, and with the first IC package tray 102 at the bottom opening 316 of the chest 306, the count of the number of IC packages within the first IC package tray 102 is indicated by the counting label over a last pocket to be filled within the first IC package tray 102 (i.e., "7" in the example of FIGS. 1 and 10 as circled in FIG. 10).

Figure 11:
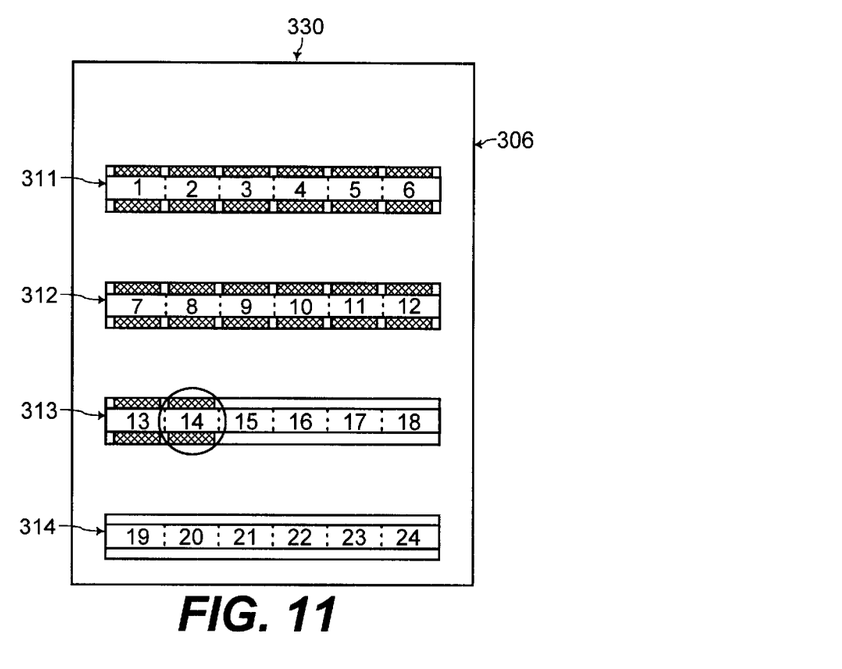
FIG. 11 shows the top view of the chest of FIG. 5 with the second counting grid of FIG. 4 at a respective visible position within the chest such that the counting labels of the second counting grid appear in the viewing windows of the chest when the second IC package tray of FIG. 2 is placed at the bottom opening of the chest.

Referring to FIGS. 2 and 11, for another example, assume that the second IC package tray 202 of FIG. 2 is placed at the bottom opening 316 of the chest 306 with the second IC package tray 202 touching the rear wall 330 of the chest 306. In that case, the first viewing window 311 of the chest 306 is placed over the first row 211 of pockets of the second IC package tray 202, the second viewing window 312 is placed over the second row 212 of pockets of the second IC package tray 202, the third viewing window 313 is placed over the third row 213 of pockets of the second IC package tray 202, and the fourth viewing window 314 is placed over the fourth row 214 of pockets of the second IC package tray 202.

In addition, referring to FIGS. 9 and 11, the second counting grid 304 having the counting labels that correspond to the second IC package tray 202 is pulled out away from the rear wall 330 of the chest 306 until the counting labels of the second counting grid 304 appear through the viewing windows 311, 312, 313, and 314 of the chest 306. The first row of counting labels "1 . . . 2 . . . 3 . . . 4 . . . 5 . . . 6" appear through the first viewing window 311 of the chest 306, the second row of counting labels "7 . . . 8 . . . 9 . . . 10 . . . 11 . . . 12" appear through the second viewing window 312, the third row of counting labels "13 . . . 14 . . . 15 . . . 16 . . . 17 . . . 18" appear through the third viewing window 313, and the fourth row of counting labels "19 . . . 20 . . . 21 . . . 22 . . . 23 . . . 24" appear through the fourth viewing window 314.

Referring to FIG. 8, note that the first counting grid 302 is still at the hidden position such that the counting labels of the first counting grid 302 do not appear through the viewing windows 311, 312, 313, and 314 of the chest 306. With the counting labels of the second counting grid 304 appearing through the viewing windows 311, 312, 313, and 314 of the chest 306, and with the second IC package tray 202 at the bottom opening 316 of the chest 306, the count of the number of IC packages within the second IC package tray 202 is indicated by the counting label over a last pocket to be filled within the second IC package tray 202 (i.e., "14" in the example of FIGS. 2 and 11 as circled in FIG. 11).

In this manner, any of a plurality of types of IC package trays that is partially filled is placed at the bottom opening 316 of the chest 306. The counting labels of a counting grid corresponding to the IC package tray placed at the bottom opening of chest is placed into view through the viewing windows 311, 312, 313, and 314 of the chest. The counting label over a last pocket to be filled within the IC package tray placed in the bottom opening of the chest accurately indicates the count of IC packages within the IC package tray. Thus, an operator may be saved from the time and fatigue of manually counting the number of IC packages within numerous partially filled IC package trays for many different types of IC package trays during a work shift.

The foregoing is by way of example only and is not intended to be limiting. For example, the present invention is described for two different types of IC package trays with two counting grids within the chest 206. However, the present invention may be practiced for more numerous types of IC package trays with more numerous corresponding counting grids within the chest 306, as would be apparent to one of ordinary skill in the art of IC package manufacture from the description herein. In addition, the present invention has been described with four rows as the predetermined number of rows of pockets of the IC package trays. However, the present invention may be practiced for more numerous rows of pockets of the IC package trays, as would be apparent to one of ordinary skill in the art of IC package manufacture from the description herein.

In addition, the present invention has been described for IC package trays having a same predetermined number of rows of pockets for holding IC packages with the pockets being filled in the sequential order of row by row from a first row to a last row and from a first column to a last column within each row. However, the present invention may also be used when each of the different types of IC package trays has a same predetermined number of columns of pockets that are filled in the sequential order of column by column from a first column to a last column and from a first row to a last row within each column, as would be apparent to one of ordinary skill in the art of IC package manufacture from the description herein.

Figure 12:
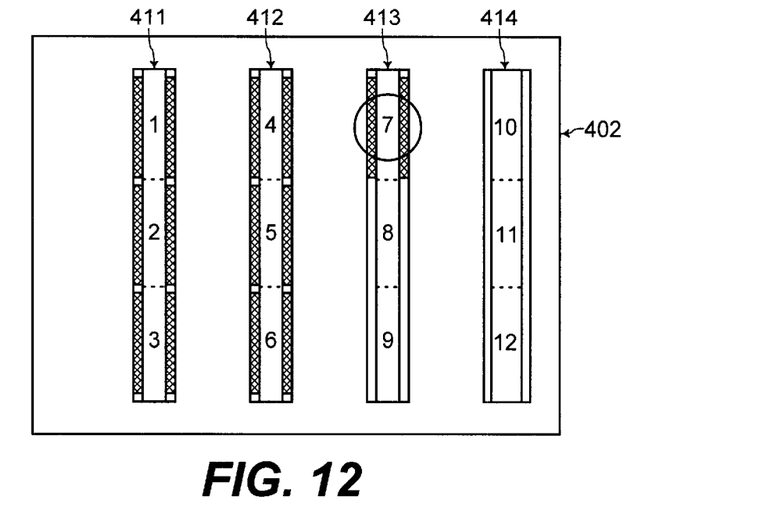
FIG. 12 illustrates a chest of counting grids used for indicating the count of IC packages within an IC package tray having a predetermined number of columns of pockets that are partially filled with IC packages column by column.

For example, referring to FIG. 12, the viewing windows 411, 412, 413, and 414 of a chest 402 are aligned along the columns of pockets of an IC package tray. The counting grid corresponding to the IC package tray has counting labels that are numerically ordered according to the sequential order of filling the pockets column by column from a first column to a last column and from a first row to a last row within each column. Similar to FIGS. 10 and 11, the count of the number of IC packages within the IC package tray in FIG. 12 is then indicated by the counting label over a last pocket to be filled within the IC package tray (i.e., "7" as circled in FIG. 12).

Furthermore, as will be understood by those skilled in the art, the structures described herein may be made or used in the same way regardless of their position and orientation. Accordingly, it is to be understood that terms and phrases such as "top," "side," "bottom," "rear," "over," and "front" as used herein refer to relative location and orientation of various portions of the structures with respect to one another, and are not intended to suggest that any particular absolute orientation with respect to external objects is necessary or required.

The present invention is limited only as defined in the following claims and equivalents thereof

We claim:

1. An apparatus for indicating a count of IC (integrated circuit) packages for a plurality of types of IC (integrated circuit) package trays, each of said plurality of types of IC package trays having a same predetermined number of rows of pockets for carrying IC packages, and each of said plurality of types of IC package trays having a respective number of columns of pockets for carrying IC packages, the apparatus comprising:

a plurality of counting grids, each counting grid having respective counting labels corresponding to a respective type of IC package tray, wherein each of said respective counting labels are arranged to be over a respective pocket of said respective type of IC package tray corresponding to a counting grid when said counting grid is placed over said respective type of IC package tray with said predetermined number of rows of counting labels on said counting grid being aligned to said predetermined number of rows of pockets of said respective type of IC package tray, and wherein said respective counting labels of said counting grid are numerically ordered according to an order of filling said pockets of said respective type of IC package tray; and a chest including:

a bottom opening for holding an IC package tray that is partially filled with IC packages;

a plurality of slots disposed through the chest with each slot holding a respective one of said counting grids disposed over and parallel with said IC package tray placed in said bottom opening of said chest such that said predetermined number of rows of counting labels of a counting grid are aligned to said predetermined number of rows of pockets of said IC package tray placed in said bottom opening of said chest; and a plurality of viewing windows through the top of the chest, each viewing window being aligned over a respective one of said predetermined number of rows of pockets of said IC package tray placed in said bottom opening of said chest;

wherein each row of counting labels of each of said counting grids within said chest is out of view through said viewing window when each of said counting grids are at a respective hidden position within said slots of said chest, and wherein a respective counting grid corresponding to said IC package tray placed in said bottom opening of said chest is placed to a respective visible position within said chest such that counting labels on said respective counting grid are visible through said plurality of viewing windows through the top of said chest, and wherein a counting label of said respective counting grid over a last pocket to be filled within said IC package tray placed in said bottom opening of said chest indicates the count of IC packages within said IC package tray placed in said bottom opening of said chest.

2. The apparatus of claim 1, wherein said chest includes a front side having a tray opening such that an IC package tray is slid through said tray opening to be placed in said bottom opening of said chest.

3. The apparatus of claim 1, wherein said chest includes a rear wall, and wherein said IC package tray is pushed through said bottom opening of said chest to touch said rear wall of said chest such that said predetermined number of rows of pockets of said IC package tray is aligned with said plurality of viewing windows of said chest.

4. The apparatus of claim 1, wherein said chest includes a front side having a plurality of slot openings, and wherein a counting grid is slid through a slot opening on said front side of said chest to be placed within a slot corresponding to said counting grid.

5. The apparatus of claim 1, wherein said chest includes a rear wall, and wherein each counting grid is pushed through a respective slot of said chest to touch said rear wall to be placed to said respective hidden position within said chest.

6. The apparatus of claim 5, wherein said respective counting grid corresponding to said IC package tray, placed in said bottom opening of said chest, is pulled out of said chest away from said rear wall until said counting labels on said respective counting grid are visible through said viewing windows of said chest to be placed in said respective visible position.

7. A method for indicating a count of IC (integrated circuit) packages for a plurality of types of IC (integrated circuit) package trays, each of said plurality of types of IC package trays having a same predetermined number of rows of pockets for carrying IC packages, and each of said plurality of types of IC package trays having a respective number of columns of pockets for carrying IC packages, the method including the steps of:

placing each of a plurality of counting grids within a respective slot of a chest, each counting grid having respective counting labels corresponding to a respective type of IC package tray, wherein each of said respective counting labels are arranged to be over a respective pocket of said respective type of IC package tray corresponding to a counting grid when said counting grid is placed over said respective type of IC package tray with said predetermined number of rows of counting labels on said counting grid being aligned to said predetermined number of rows of pockets of said respective type of IC package tray, and wherein said respective counting labels of said counting grid are numerically ordered according to an order of filling said pockets of said respective type of IC package tray;

placing an IC package tray that is partially filled with IC packages within a bottom opening within said chest such that each of a plurality of viewing windows through the top of the chest is aligned over a respective one of said predetermined number of rows of pockets of said IC package tray placed in said bottom opening of said chest;

aligning each of said counting grids within a respective slot of said chest to be disposed over and parallel with said IC package tray placed in said bottom opening of said chest such that said predetermined number of rows of counting labels of a counting grid are aligned to said predetermined number of rows of pockets of said IC package tray placed in said bottom opening of said chest;

placing each of said counting grids to be at a respective hidden position within said chest, wherein each row of counting labels of each of said counting grids within said chest is out of view through said viewing window when each of said counting grids are at said respective hidden position within said chest; and placing a respective counting grid corresponding to said IC package tray, placed in said bottom opening of said chest, to a respective visible position within said chest such that counting labels on said respective counting grid are visible through said plurality of viewing windows through the top of said chest, and wherein a counting label of said respective counting grid over a last pocket to be filled within said IC package tray placed in said bottom opening of said chest indicates the count of IC packages within said IC package tray placed in said bottom opening of said chest.

8. The method of claim 7, further including the step of:

sliding said IC package tray through a tray opening at a front side of said chest to be placed in said bottom opening of said chest.

9. The method of claim 7, further including the step of:

pushing said IC package tray through said bottom opening of said chest to touch a rear wall of said chest such that said predetermined number of rows of pockets of said IC package tray is aligned with said plurality of viewing windows of said chest.

10. The method of claim 7, further including the step of:

sliding a respective counting grid through each of a plurality of slot openings on a front side of said chest to be placed within a slot corresponding to said respective counting grid within said chest.

11. The method of claim 7, further including the step of:

pushing each counting grid through a respective slot of said chest to touch a rear wall of said chest to be placed to said respective hidden position within said chest.

12. The method of claim 11, further including the step of:

pulling said respective counting grid corresponding to said IC package tray, placed in said bottom opening of said chest, out of said chest away from said rear wall until said counting labels on said respective counting grid are visible through said viewing windows of said chest to be placed in said respective visible position.

13. An apparatus for indicating a count of IC (integrated circuit) packages for a plurality of types of IC (integrated circuit) package trays, each of said plurality of types of IC package trays having a same predetermined number of columns of pockets for carrying IC packages, and each of said plurality of types of IC package trays having a respective number of rows of pockets for carrying IC packages, the apparatus comprising:

a plurality of counting grids, each counting grid having respective counting labels corresponding to a respective type of IC package tray, wherein each of said respective counting labels are arranged to be over a respective pocket of said respective type of IC package tray corresponding to a counting grid when said counting grid is placed over said respective type of IC package tray with said predetermined number of columns of counting labels on said counting grid being aligned to said predetermined number of columns of pockets of said respective type of IC package tray, and wherein said respective counting labels of said counting grid are numerically ordered according to an order of filling said pockets of said respective type of IC package tray; and a chest including:

a bottom opening for holding an IC package tray that is partially filled with IC packages;

a plurality of slots disposed through the chest with each slot holding a respective one of said counting grids disposed over and parallel with said IC package tray placed in said bottom opening of said chest such that said predetermined number of columns of counting labels of a counting grid are aligned to said predetermined number of columns of pockets of said IC package tray placed in said bottom opening of said chest; and a plurality of viewing windows through the top of the chest, each viewing window being aligned over a respective one of said predetermined number of columns of pockets of said IC package tray placed in said bottom opening of said chest;

wherein each column of counting labels of each of said counting grids within said chest is out of view through said viewing window when each of said counting grids are at a respective hidden position within said slots of said chest, and wherein a respective counting grid corresponding to said IC package tray placed in said bottom opening of said chest is placed to a respective visible position within said chest such that counting labels on said respective counting grid are visible through said plurality of viewing windows through the top of said chest, and wherein a counting label of said respective counting grid over a last pocket to be filled within said IC package tray placed in said bottom opening of said chest indicates the count of IC packages within said IC package tray placed in said bottom opening of said chest.

14. The apparatus of claim 13, wherein said chest includes a front side having a tray opening such that an IC package tray is slid through said tray opening to be placed in said bottom opening of said chest.

15. The apparatus of claim 13, wherein said chest includes a rear wall, and wherein said IC package tray is pushed through said bottom opening of said chest to touch said rear wall of said chest such that said predetermined number of columns of pockets of said IC package tray is aligned with said plurality of viewing windows of said chest.

16. The apparatus of claim 13, wherein said chest includes a front side having a plurality of slot openings, and wherein a counting grid is slid through a slot opening on said front side of said chest to be placed within a slot corresponding to said counting grid.

17. The apparatus of claim 13, wherein said chest includes a rear wall, and wherein each counting grid is pushed through a respective slot of said chest to touch said rear wall to be placed to said respective hidden position within said chest.

18. The apparatus of claim 17, wherein said respective counting grid corresponding to said IC package tray, placed in said bottom opening of said chest, is pulled out of said chest away from said rear wall until said counting labels on said respective counting grid are visible through said viewing windows of said chest to be placed in said respective visible position.

19. A method for indicating a count of IC (integrated circuit) packages for a plurality of types of IC (integrated circuit) package trays, each of said plurality of types of IC package trays having a same predetermined number of columns of pockets for carrying IC packages, and each of said plurality of types of IC package trays having a respective number of rows of pockets for carrying IC packages, the method including the steps of:

placing each of a plurality of counting grids within a respective slot of a chest, each counting grid having respective counting labels corresponding to a respective type of IC package tray, wherein each of said respective counting labels are arranged to be over a respective pocket of said respective type of IC package tray corresponding to a counting grid when said counting grid is placed over said respective type of IC package tray with said predetermined number of columns of counting labels on said counting grid being aligned to said predetermined number of columns of pockets of said respective type of IC package tray, and wherein said respective counting labels of said counting grid are numerically ordered according to an order of filling said pockets of said respective type of IC package tray;

placing an IC package tray that is partially filled with IC packages within a bottom opening within said chest such that each of a plurality of viewing windows through the top of the chest is aligned over a respective one of said predetermined number of columns of pockets of said IC package tray placed in said bottom opening of said chest;

aligning each of said counting grids within a respective slot of said chest to be disposed over and parallel with said IC package tray placed in said bottom opening of said chest such that said predetermined number of columns of counting labels of a counting grid are aligned to said predetermined number of columns of pockets of said IC package tray placed in said bottom opening of said chest;

placing each of said counting grids to be at a respective hidden position within said chest, wherein each column of counting labels of each of said counting grids within said chest is out of view through said viewing window when each of said counting grids are at said respective hidden position within said chest; and placing a respective counting grid corresponding to said IC package tray, placed in said bottom opening of said chest, to a respective visible position within said chest such that counting labels on said respective counting grid are visible through said plurality of viewing windows through the top of said chest, and wherein a counting label of said respective counting grid over a last pocket to be filled within said IC package tray placed in said bottom opening of said chest indicates the count of IC packages within said IC package tray placed in said bottom opening of said chest.

20. The method of claim 19, further including the step of:

sliding said IC package tray through a tray opening at a front side of said chest to be placed in said bottom opening of said chest.

21. The method of claim 19, further including the step of:

pushing said IC package tray through said bottom opening of said chest to touch a rear wall of said chest such that said predetermined number of columns of pockets of said IC package tray is aligned with said plurality of viewing windows of said chest.

22. The method of claim 19, further including the step of:

sliding a respective counting grid through each of a plurality of slot openings on a front side of said chest to be placed within a slot corresponding to said respective counting grid within said chest.

23. The method of claim 19, further including the step of:

pushing each counting grid through a respective slot of said chest to touch a rear wall of said chest to be placed to said respective hidden position within said chest.

24. The method of claim 23, further including the step of:

pulling said respective counting grid corresponding to said IC package tray, placed in said bottom opening of said chest, out of said chest away from said rear wall until said counting labels on said respective counting grid are visible through said viewing windows of said chest to be placed in said respective visible position.

\* \* \* \* \*